(12) United States Patent
Nakano (10) Patent No.: US 11,384,423 B2
(45) Date of Patent: Jul. 12, 2022

(54) SPUTTERING APPARATUS AND SPUTTERING METHOD

(71) Applicant: ULVAC, INC., Kanagawa (JP)

(72) Inventor: Katsuaki Nakano, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 17/272,876

(22) PCT Filed: Sep. 12, 2019

(86) PCT No.: PCT/JP2019/035870
§ 371 (c)(1),
(2) Date: Mar. 2, 2021

(87) PCT Pub. No.: WO2020/137027
PCT Pub. Date: Jul. 2, 2020

(65) Prior Publication Data
US 2021/0292886 A1 Sep. 23, 2021

(30) Foreign Application Priority Data

Dec. 26, 2018 (JP) .............................. JP2018-242472

(51) Int. Cl.
*C23C 14/34* (2006.01)
*H01J 37/34* (2006.01)
*H01J 37/32* (2006.01)

(52) U.S. Cl.
CPC .... *C23C 14/3407* (2013.01); *H01J 37/32568* (2013.01); *H01J 37/3417* (2013.01); *H01J 37/3435* (2013.01)

(58) Field of Classification Search
None
See application file for complete search history.

(56) References Cited

U.S. PATENT DOCUMENTS

| | | | |
|---|---|---|---|
| 6,451,184 B1* | 9/2002 | Sone | C23C 14/0063 204/298.11 |
| 6,562,200 B2* | 5/2003 | Iwase | H01J 37/3447 204/192.12 |

(Continued)

FOREIGN PATENT DOCUMENTS

| | | |
|---|---|---|
| JP | 7-316806 A | 12/1995 |
| JP | 09-213634 A | 8/1997 |

(Continued)

OTHER PUBLICATIONS

International Search Report for PCT Patent App. No. PCT/JP2019/035870 (dated Nov. 19, 2019).

*Primary Examiner* — Jason Berman
(74) *Attorney, Agent, or Firm* — Cermak Nakajima & McGowan LLP; Tomoko Nakajima (57) ABSTRACT

A sputtering apparatus (SM) has a vacuum chamber in which is disposed a target. A plasma atmosphere is formed inside the vacuum chamber to thereby sputter the target. The sputtered particles splashed from the target are caused to get adhered to, and deposited on, a surface of a substrate disposed in the vacuum chamber, thereby forming a predetermined thin film thereon. At such a predetermined position inside the vacuum chamber as is subject to adhesion of the sputtered particles splashed from the target, there is disposed an adhesion body whose at least the surface of adhesion of the sputtered particles is made of a material equal in kind to that of the target. The adhesion body has connected thereto a bias power supply for applying a bias voltage having negative potential at the time of forming the plasma atmosphere.

9 Claims, 4 Drawing Sheets

(56) References Cited

U.S. PATENT DOCUMENTS

| | | | | |
|---|---|---|---|---|
| 2005/0211547 | A1* | 9/2005 | Hanawa | ................ C23C 14/358 |
| | | | | 204/192.12 |
| 2009/0065349 | A1* | 3/2009 | Kim | ................... C23C 14/3407 |
| | | | | 204/192.12 |
| 2013/0056348 | A1 | 3/2013 | Papa et al. | |
| 2017/0294294 | A1 | 10/2017 | Haymore et al. | |

FOREIGN PATENT DOCUMENTS

| | | |
|---|---|---|
| JP | 2008-053460 A | 3/2008 |
| JP | 2013-053369 A | 3/2013 |
| JP | 2017-133065 A | 8/2017 |
| JP | 2017-190526 A | 10/2017 |

* cited by examiner

SPUTTERING APPARATUS AND SPUTTERING METHOD

This application is a national phase entry under 35 U.S.C. § 371 of PCT Patent Application No. PCT/JP2019/035870, filed on Sep. 12, 2019, which claims priority under 35 U.S.C. § 119 to Japanese Patent Application No. 2018-242472, filed Dec. 26, 2018, both of which are incorporated by reference.

TECHNICAL FIELD

The present invention relates to a sputtering apparatus and a sputtering method and, in particular, to those which are capable of improving the utilization efficiency of a target.

BACKGROUND ART

In the process of manufacturing semiconductor devices, there is a step of forming a thin film such as a barrier film, a seed layer and the like on the bottom surface and side surfaces of halls and trenches formed on the surface of a substrate to be processed (hereinafter called "a to-be-processed substrate"). A sputtering apparatus is generally used in this kind of film formation. There is known, e.g., in patent document 1 a sputtering apparatus which is capable of forming a thin film on the bottom surface and side surfaces of halls and trenches with good coverage and also with good symmetry relative to the halls and trenches (i.e., such that the film thickness of the thin film to be formed on such side surfaces of the holes and trenches as lie opposite to each other become equivalent to each other).

The above-mentioned conventional example is a so-called Long Throw Sputtering (LTS) system which has: a vacuum chamber capable of forming a vacuum atmosphere; a target disposed on an upper part of the vacuum chamber; and a stage which is disposed on a lower part inside the vacuum chamber and on which a to-be-processed substrate is set in position in a manner to lie opposite to the target. In this case, the distance between the target and the to-be-processed substrate on the stage (T/S distance) is set longer than that in the ordinary sputtering apparatus. According to this arrangement, the ratio of the sputtered particles having rectilinearity among those that reach the surface of the to-be-processed substrate, can be increased. As a result, it becomes possible to form a film with good coverage and symmetry.

By the way, when the target is sputtered, the sputtered particles are splashed out of the surface of the target according to the predetermined cosine law, but the sputtered particles partly splash toward other than the to-be-processed substrate. In this case, the sputtered particles that have adhered to the constituent parts such as deposition preventive plates which are present inside the vacuum chamber are ordinarily only discarded (wasted). And as in the above-mentioned conventional example, if the T/S distance is set longer in order to increase the ratio of the sputtered particles having rectilinearity, the amount of the sputtered particles that get adhered to other than the to-be-processed substrate will increase. This has a problem in that the utilization efficiency of the target is poor.

PRIOR ART DOCUMENTS

Patent Documents

Patent Document 1: JP 1997-213634 A

SUMMARY OF THE INVENTION

Problems that the Invention is to Solve

This invention has been made in view of the above-mentioned point and has a problem of providing a sputtering apparatus and a sputtering method in which the utilization efficiency of the target can be improved without impairing the function of forming a predetermined thin film on the bottom surface and the side surfaces of a hole and a trench formed on the surface of the to-be-processed substrate with good coverage and symmetry.

Means for Solving the Problems

In order to solve the above-mentioned problem, this invention is a sputtering apparatus comprising a vacuum chamber having disposed therein a target, in which: the vacuum chamber is adapted to form therein a plasma atmosphere for sputtering the target; sputtered particles splashed from the target are caused to get adhered to, and deposited on, a surface of a to-be-processed substrate disposed in the vacuum chamber to thereby form a predetermined thin film thereon. At such a predetermined position inside the vacuum chamber as is subject to adhesion of the sputtered particles splashed from the target, there is disposed an adhesion body whose at least the surface of adhesion of the sputtered particles is made of a material equal in kind to that of the target. The adhesion body has connected thereto a bias power supply for applying a bias voltage having negative potential at a time of forming the plasma atmosphere.

According to this invention, for example, if a rare gas such as argon and the like is introduced into an evacuated vacuum chamber at a predetermined flow rate, and a predetermined power having a negative potential is applied to the target, a plasma atmosphere is formed inside the vacuum chamber. By means of the ions of the rare gas in the plasma atmosphere the surface of the target gets sputtered, and the sputtered particles are splashed and partly come to be adhered to the surface of the adhesion body. At this time since the surface of adhesion of the sputtered particles is made of a material equal in kind to that of the target, when the bias voltage is applied to the adhesion body, also the adhesion surface gets sputtered by the ions of the rare gas in the plasma atmosphere. As a result, the sputtered particles equal in kind to the above-mentioned sputtered particles (hereinafter referred to as "re-sputtered particles") get splashed, and they partly come to be adhered also to the surface of the target. As explained, according to this invention, the sputtered particles splashed toward other than the to-be-processed substrate are once recovered by partly causing to get adhered to the adhesion body. This adhesion surface to which the sputtered particles got adhered is also subjected to sputtering. The re-sputtered particles inclusive of the sputtered particles that have been adhered are returned to the surface of the target. In this manner, it becomes possible to increase the utilization efficiency of the target. By the way, if the bias voltage to be applied to the adhesion body is higher than the voltage to be applied to the target, the sputtering of the adhesion body will become controlling over the sputtering of the target and therefore there will occur a disadvantage in that a predetermined thin film cannot be formed on the surface of the to-be-processed substrate. Further, the application of the bias voltage to the adhesion body can be made not only during the sputtering of the target, but also can be independently made as a separate step after having finished the film formation by the sputtering of the target.

In this invention, preferably the target is defined as a first target, the adhesion body is defined as a second target that is made of a material equal in kind to that of the first target, and the first target and the to-be-processed substrate are disposed inside the vacuum chamber to lie opposite to each other. In this arrangement, preferably the second target is disposed in a space between the first target and the to-be-processed substrate in a manner to lie opposite to the first target, and the second target has opened through a plate thickness of the second target a first through-hole in a manner to allow for passage therethrough of the sputtered particles.

According to the above-mentioned arrangement, by making the second target, serving as the adhesion body, to lie opposite to the first target, much more of the sputtered particles splashed from the first target can be caused to get adhered to the second target for the purpose of recovering. As a result, much more of the re-sputtered particles can be returned to the surface of the first target and, accordingly, the utilization efficiency of the first target can still further be enhanced. In addition, since the sputtered particles splashed from the first target are incident on the to-be-processed substrate through the first through-hole opened through the second target, the thin film can be formed over the surface of the to-be-processed substrate with good in-plane distribution of film thickness. In this case, by constituting the first through-hole by a plurality of through-holes, the second target itself will function as a collimator which restricts the sputtered particles incident on the to-be-processed substrate beyond a predetermined angle relative to an imaginary line that extends in the direction perpendicular to the surface of the to-be-processed substrate. In case a film is to be formed on a bottom surface and side surfaces of a hole and a trench that are formed on the surface of the to-be-processed substrate, the predetermined thin film can be formed with good coverage and symmetry. According to this arrangement, unlike the above-mentioned sputtering apparatus of the LTS system, T/S distance need not be set long. Not only can the apparatus arrangement be advantageously downsized, but also can the film-forming rate be improved.

According to this invention, provided that the direction from the to-be-processed substrate toward the first target is defined to be upward, and in which the first target and the to-be-processed substrate are offset to each other in a direction at right angles to the upward direction, the sputtering apparatus preferably further comprises: a stage which rotatably holds the to-be-processed substrate; and a distribution plate disposed in a space between the second target and the stage in order to partly restrict the sputtered particles that pass through the first through-hole and proceed toward the to-be-processed substrate. According to this arrangement, the amount of incidence of the sputtered particles to the surface of the to-be-processed substrate is restricted by the distribution plate. Therefore, film formation can be made with good film thickness distribution over the entire surface of the to-be-processed substrate.

In addition, according to this invention, the sputtering apparatus preferably further comprises an electrode plate of grounding potential disposed in the space between the second target and the stage, the electrode plate having formed therein a second through-hole allowing for the passage of the sputtered particles. According to this arrangement, there can prevent the occurrence of disadvantage in that the lower surface of the second target gets sputtered as a result of formation of a plasma atmosphere in the space between the second target and the to-be-processed target.

Further, in order to solve the above-mentioned problem, the sputtering method using the above-mentioned sputtering apparatus comprises the steps of: sputtering the target to thereby cause the sputtered particles to get adhered to the adhesion body; and at the same time, applying to the adhesion body a bias potential which is lower than the voltage to be applied to the target so as to cause to adhere the sputtered particles, once adhered to the adhesion body, once again to the target.

In addition, in order to solve the above-mentioned problem, the sputtering method using the above-mentioned sputtering apparatus comprises a first step of sputtering the target to thereby cause the sputtered particles to get adhered to the adhesion body; and a second step of applying to the adhesion body a bias potential so as to cause to adhere the sputtered particles, already adhered to the adhesion body, once again to the target.

MODE FOR CARRYING OUT THE INVENTION

A description will hereinbelow be made, with reference to the drawings, of an embodiment of a sputtering apparatus of this invention by citing an example in which: a target is selected to be made of Cu; a to-be-processed substrate is selected to be a silicon wafer in which silicon oxide film is formed to a predetermined thickness on the surface of the silicon wafer, and then on this silicon oxide film fine recessed parts with an aspect ratio of, e.g., 3 or more are formed in a predetermined pattern (hereinafter referred to as "substrate Sw"); and a Cu film is formed on the surface of the substrate Sw inclusive of the bottom surface and side surfaces of this recessed part. In the following description, the terms denoting the directions such as "upper" and "lower" shall be understood to be based on the posture of setting in position the sputtering apparatus shown in FIG. 1.

Figure 1:
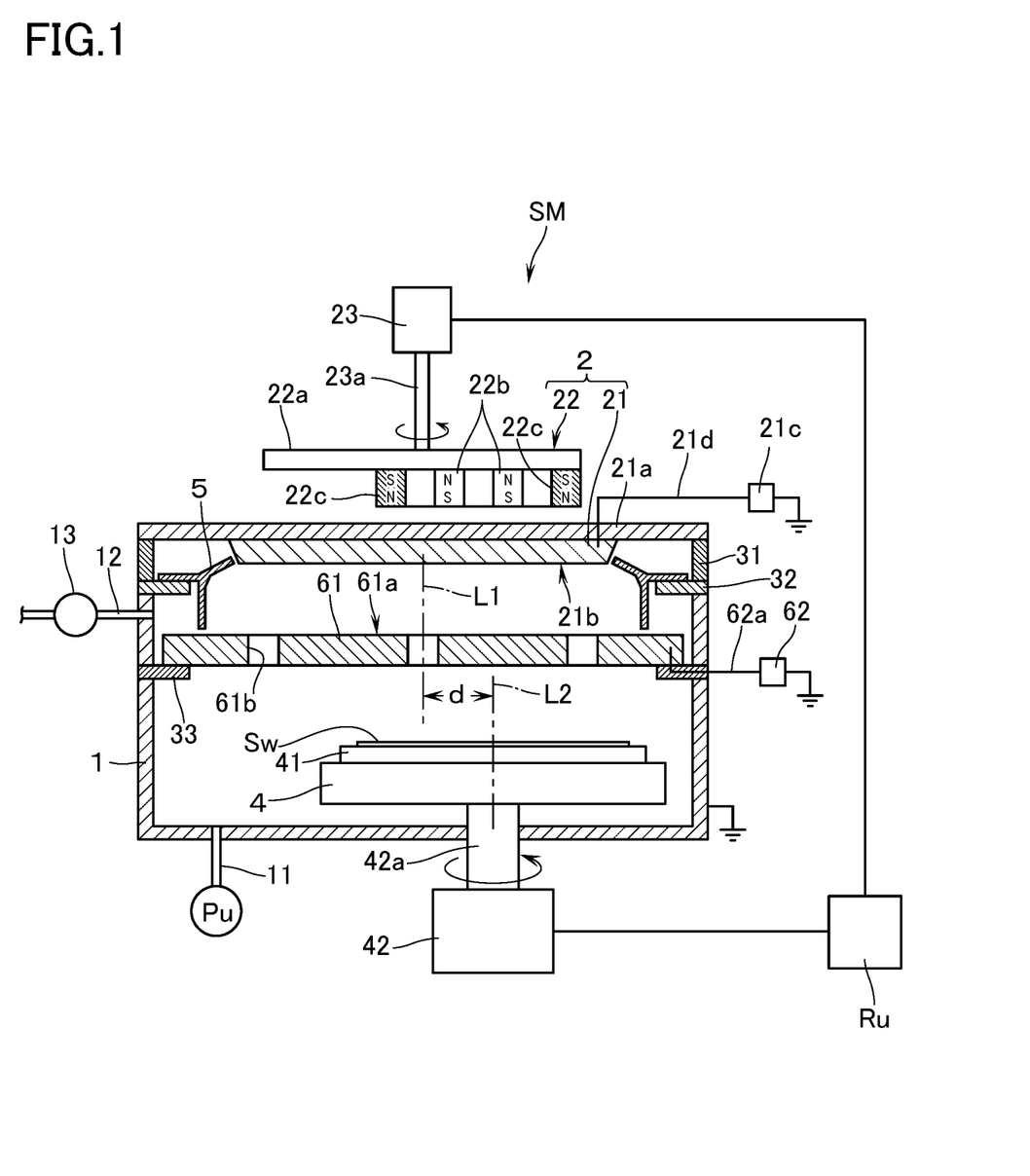
FIG. 1 is a schematic sectional view showing a sputtering apparatus according to an embodiment of this invention.

With reference to FIG. 1, the mark SM denotes a sputtering apparatus of this embodiment. The sputtering apparatus SM is provided with a vacuum chamber 1 in which a vacuum atmosphere can be formed. To the bottom of the vacuum chamber 1 there is connected an exhaust pipe 11 which is in communication with a vacuum exhaust means Pu made up of a turbo molecular pump, a rotary pump, and the like. To a side wall of the vacuum chamber 1 there is connected a gas introduction pipe 12 which introduces a sputtering gas into the vacuum chamber 1. The gas introduction pipe 12 has interposed therein a massflow controller 13, and is in communication with a gas source (not illustrated). The sputtering gas includes not only rare gases such as argon gas to be introduced into the vacuum chamber 1 at the time of forming a plasma atmosphere therein, but also reactive gases such as oxygen gas, nitrogen gas, and the like. Accordingly, it is so arranged that the sputtering gas whose flow rate has been controlled by the massflow controller 13 can be introduced into the evacuated vacuum chamber 1 by the vacuum exhaust means Pu at a constant evacuating speed and that, during film formation, the pressure (total pressure) inside the vacuum chamber 1 can be kept substantially constant.

In an upper surface opening of the vacuum chamber 1, there is detachably mounted a cathode unit 2. The cathode unit 2 is made up of a target 21 made of metal (made of Cu); and a magnet unit 22 which is disposed above the target 21. The target 21 is formed so as to have a circular contour depending on the contour of the substrate Sw. In a state in which the target 21 is bonded to the bucking plate 21a, the target 21 is mounted on an upper part of the vacuum chamber 1 in a posture in which the sputtering surface (i.e., the surface to get sputtered) 21b faces downward, through an insulating body 31 that is provided on an upper part of the side wall of the vacuum chamber 1.

The target 21 has connected thereto an output 21d from a sputtering power supply 21c which is made up of DC power supply and high frequency power supply, so that a predetermined power having a negative potential can be applied. The magnet unit 22 has a known closed magnetic field or a cusped magnetic field construction which efficiently ionize the sputtered particles splashed from the target 21 by generating a magnetic field in the space below the sputtering surface 21b of the target 21 and which capture the electrons and the like ionized below the sputtering surface 21b at the time of sputtering. The magnet unit is made up, e.g., of; a plate-shaped yoke 22a made of a magnetic material; a plurality of central magnets 22b which are of the same magnetization and arranged in a circle side by side below the yoke 22a; and a plurality of peripheral magnets 22c which are of the same magnetization and arranged in a circle so as to enclose the periphery of the central magnet 22b. To the upper surface of the yoke 22a there is connected a rotary shaft 23a of the motor 23 so that, during film formation, the magnet unit 22 can be rotated about the center of the target 21 serving as the center of rotation.

At the bottom of the vacuum chamber 1 there is provided a stage 4 for holding the substrate Sw in a state of being offset from the center of the target 21 to a radially one side (right-and-left direction in the Figure) at a predetermined distance. Here, the distance (i.e., an offset amount) d between an imaginary line L1 which extends vertically through the center of the target 21 and an imaginary line L2 which extends vertically through the center of the substrate Sw is appropriately set taking into consideration the sizes of the target 21 and the substrate Sw. On the upper part of the stage 4 there is provided a chuck plate 41 having assembled therein electrodes (not illustrated) for an electrostatic chuck. It is thus so arranged that, by applying a predetermined DC voltage to the electrodes, the substrate Sw can be electrostatically suctioned to the surface of the chuck plate 41 with the film forming surface of the substrate Sw facing upward. To the center of the lower surface of the stage 4, there is connected a rotary shaft 42a of the motor 42, through the lower wall of the vacuum chamber 1, via a vacuum sealing member (not illustrated). During film formation, the substrate Sw is arranged to be rotated at a predetermined number of revolution. By the way, although not described by illustrating in particular, the stage 4 is provided with a coolant circulation passage, a heater and the like so that the substrate Sw can be controlled, during film forming, to a predetermined temperature.

Inside the vacuum chamber 1 there is disposed a deposition preventive plate 5 made, e.g., of a known material such as aluminum oxide, stainless steel and the like, the deposition preventive plate serving to prevent the sputtered particles splashed by sputtering of the target 21 from adhering to the inner wall surface of the vacuum chamber 1. The deposition preventive plate 5 having a contour of a cylinder is suspended through an engaging part 32 provided on the side wall of the vacuum chamber 1.

Further, the vacuum chamber 1 is provided therein with an adhesion body 61: to which the sputtered particles splashed from the target 21 get adhered; which (=adhesion body) is disposed in the space between the target 21 and the stage 4 in a manner to lie just opposite to the target 21; and at least its surface of adhesion 61a of the sputtered particles (i.e., at least such a surface of the adhesion body 61 to which the sputtered particles get adhered) is made of metal that is of the same kind as that of the target 21. In this embodiment, the adhesion body 61 is constituted by a plate-shaped second target 61 that is made of a metal (made of Cu) equal in kind to that of the target 21 (hereinafter called the "first target 21"). The second target 61 is supported by an electrically insulating material 33 disposed, e.g., on the side wall of the vacuum chamber 1. The distance between the lower surface (surface to get sputtered) 21b of the first target 21 to the upper surface (adhesion surface) 61a of the second target 61 is set to a range of 25 mm to 250 mm. If the distance is shorter than 25 mm, there occurs a disadvantage in that the lower surface of the second target 61 will get sputtered. On the other hand, if the distance in question is longer than 250 mm, there is a problem in that much more sputtered particles will get adhered to the deposition preventive plate 5.

Figure 2:
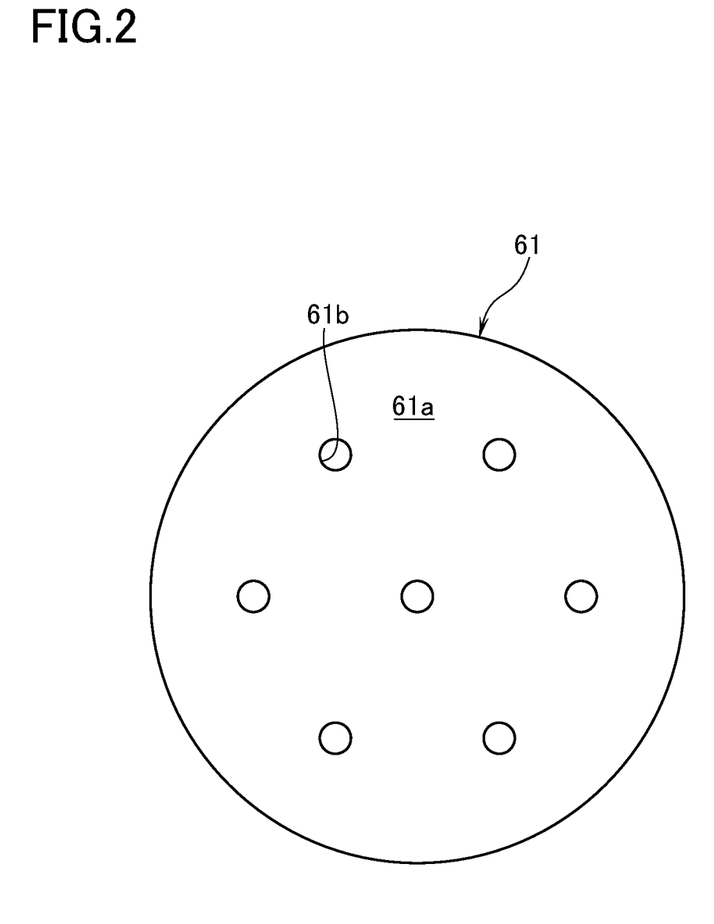
FIG. 2 is a schematic plan view of a second target shown in FIG. 1.

Further, as shown in FIG. 2, the second target 61 has a plurality of first through-holes 61b that penetrate in the vertical direction (in the plate thickness direction) of the second target so as to allow for the passage of the sputtered particles. In this embodiment, one piece of first through-hole 61b is formed in the center of the second target 61, and six pieces of first through-holes 61b are formed on a diametrically outside of the first through-hole at an equal distance from one another in the circumferential direction. The diameter, the number, and the arrangement of the first through-holes 61b are appropriately set taking into consideration the film thickness distribution at the time of film formation on the substrate Sw. In this case, preferably the opening ratio of the first through-holes 61b shall be set to 15% to 75%. If the opening ratio is below 15%, the film forming rate becomes too slow and is therefore unfit for mass production. If, on the other hand, the ratio becomes higher (larger) than 75%, the amount of sputtered particles to get adhered to the adhesion surface 61a of the second target 61 becomes smaller. Further, the aspect ratio (=thickness of the second target 61/outside diameter of the first through-hole 61b) shall preferably be set to 0.5 or more. If the aspect ratio is smaller than 0.5, it is impossible to endow the sputtered particles that passed through the second target 61 with rectilinearity. By the way, the plurality of the first through-holes 61b may be formed so as to have various outside diameters which are different from each other.

Further, the second target 61 has connected thereto an output 62a from a bias power supply 62 so that, during film formation, there is applied bias power having a lower negative DC potential (hereinafter called a "bias voltage") than the DC voltage to be applied to the first target 21 at the time of forming a plasma atmosphere. In this case, the bias voltage to be applied to the second target 61 is set such that the ratio to the DC voltage falls in a range of 2% to 90%. If the ratio of the bias voltage to the DC voltage is outside the above-mentioned range, for example, the sputtering of the second target 61 becomes more controlling than the sputtering of the first target 21. As a result, the amount of the sputtered particles that contribute to the film formation becomes less in amount, resulting in an inability to form the Cu film in a predetermined film thickness, or the film forming rate is remarkably reduced. By the way, the above-mentioned sputtering apparatus SM has a known control means (not illustrated) equipped with a microcomputer, a sequencer, and the like. It is thus so arranged that the control means performs an overall control of the operation of the vacuum evacuating means Pu, the operation of the massflow controller 13, the operation of the sputtering power source 21c, the operation of the motors 23, 42, the operation of the bias power supply 62, the operation of the moving means 72 (to be described hereinafter), and the like. A description will hereinbelow be made of a method of forming a film taking as an example the case in which a Cu film is formed on the surface of a substrate Sw by the above-mentioned sputtering apparatus SM.

After having set in position inside the vacuum chamber 1 the first target 21, the second target 61, various parts such as the deposition preventive plate 5, the vacuum exhausting means Pu is operated so as to evacuate the vacuum chamber 1. Then, a substrate Sw is transported to the stage 4 by a vacuum transport robot (not illustrated), thereby installing the substrate Sw onto the chuck plate 41 of the stage 4. Once the vacuum transport robot has retreated, a predetermined voltage is applied to the electrodes of the chuck plate 41, thereby causing the substrate Sw to be electrostatically sucked onto the chuck plate 41.

Once the inside of the vacuum chamber 1 has been evacuated to a predetermined pressure (e.g., $1\times10^{-5}$ Pa), argon gas as the sputtering gas is introduced into the vacuum chamber through the gas introduction pipe 12 at a predetermined flow amount (e.g., argon partial pressure 0.5 Pa). Together with this, a predetermined power (e.g., 5 to 30 kW) having a negative potential (e.g., 600V) is applied to the first target 21 from the sputtering power supply 21c. According to these operations, a plasma atmosphere is formed inside the vacuum chamber 1, so that the sputtering surface 21b of the first target 21 is caused to get sputtered by the ions of the argon gas in the plasma. As a result, the sputtered particles will be splashed from the first target 21. The sputtered particles will pass through the first through-holes 61b of the second target 61, thereby adhering to, and depositing on, the surface of the substrate Sw so as to form a Cu film.

Here, the sputtered particles that have been splashed by the sputtering of the first target 21 get partly adhered also to the upper surface (adhesion surface, i.e., the surface to get adhered) 61a of the second target 61. However, by the application of the bias voltage (e.g., 100 V to 150 V) from the bias power supply 62 to the second target 61, the adhesion surface 61a of the second target 61 also gets sputtered by the ions of the argon gas in the plasma. As a result, resputtered particles will be splashed, so that they will partly get adhered to the sputtering surface 21b of the first target 21. The sputtered particles adhered to this sputtering surface 21b will get sputtered once again, and the sputtered particles splashed by sputtering will partly get adhered to the surface of the substrate Sw.

According to the above-mentioned embodiment, the sputtered particles splashed toward the substrate Sw will partly be recovered by causing them to once get adhered to the adhesion surface 61a of the second target 61, and then the adhesion surface 61a to which the sputtered particles get adhered is also subject to sputtering. By thus returning (or by reduction of) the resputtered particles inclusive of the adhered sputtered particles back to the sputtering surface 21b of the first target 21, the utilization efficiency of the first target 21 can be enhanced. In addition, by disposing the second target 61 just opposite to the first target 21, among the sputtered particles that are splashed from the first target 21, many of those not contributing to the film forming are caused to get adhered to the adhesion surface 61a of the second target 21, and thereby being recovered. Therefore, more of the resputtered particles can be returned to the sputtering surface 21b of the first target 21, thereby further enhancing the utilization efficiency of the first target 21.

In addition, the sputtered particles that are splashed from the first target 21 are incident on the substrate Sw by passing through the first through-holes 61b perforated in the second target 61. Therefore, the second target 61 itself functions as a collimator which restricts the sputtered particles incident on the substrate Sw beyond a predetermined angle relative to the imaginary line L1 that extends in the direction at right angles to the surface of the substrate Sw. In case film forming is made on the bottom surface and side surfaces of a recessed part such as halls and trenches formed on the surface of the substrate Sw, film forming can be made of a predetermined thin film at a good coverage and symmetry. As a result, unlike the above-mentioned LTS system of sputtering apparatus, there is no need of setting the T/S distance longer. In this manner, not only can the apparatus arrangement be downsized, but also can advantageously the film forming rate be improved.

Figure 3:
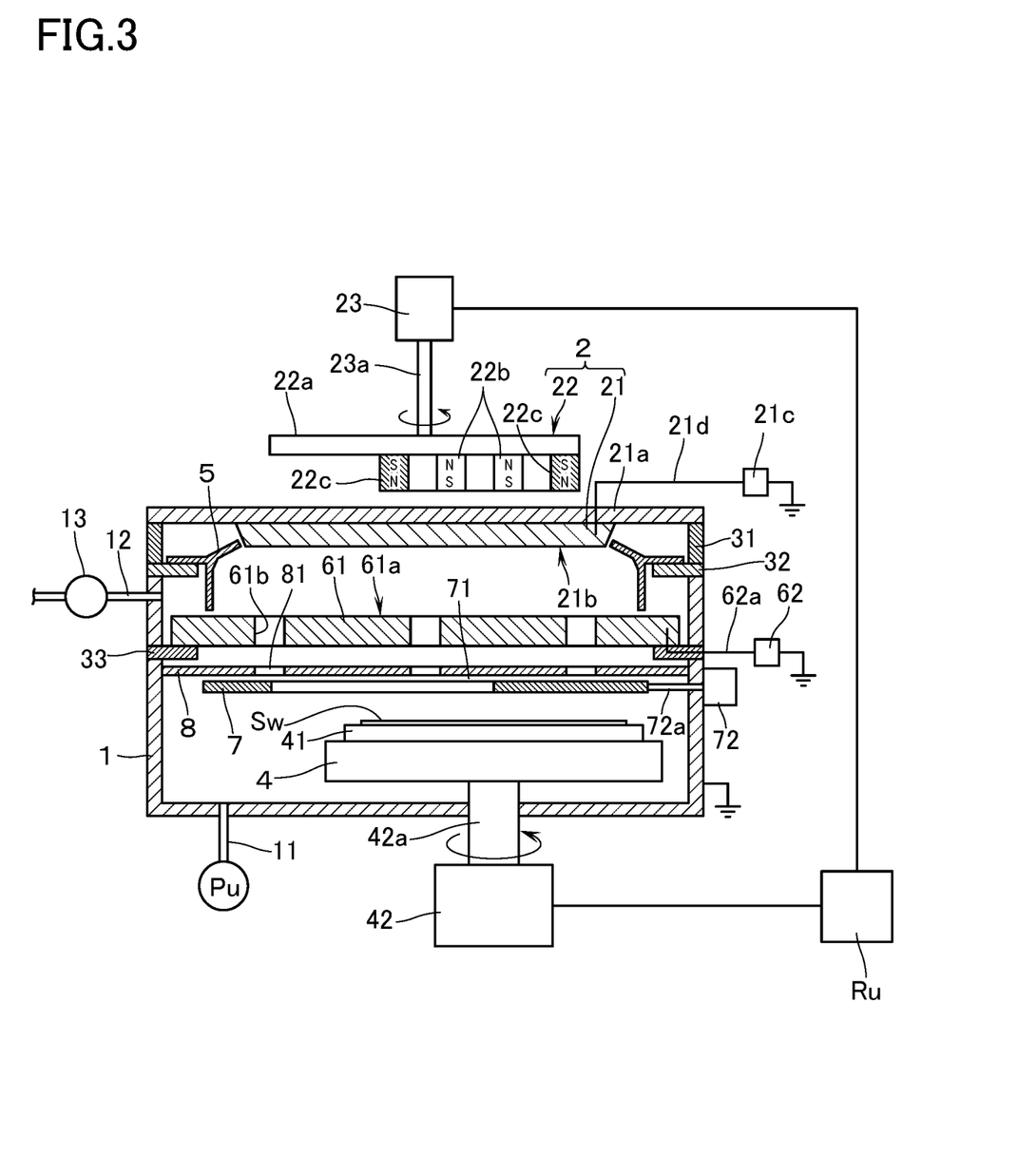
FIG. 3 is a schematic sectional view showing a sputtering apparatus according to a modified embodiment of this invention.
Figure 4:
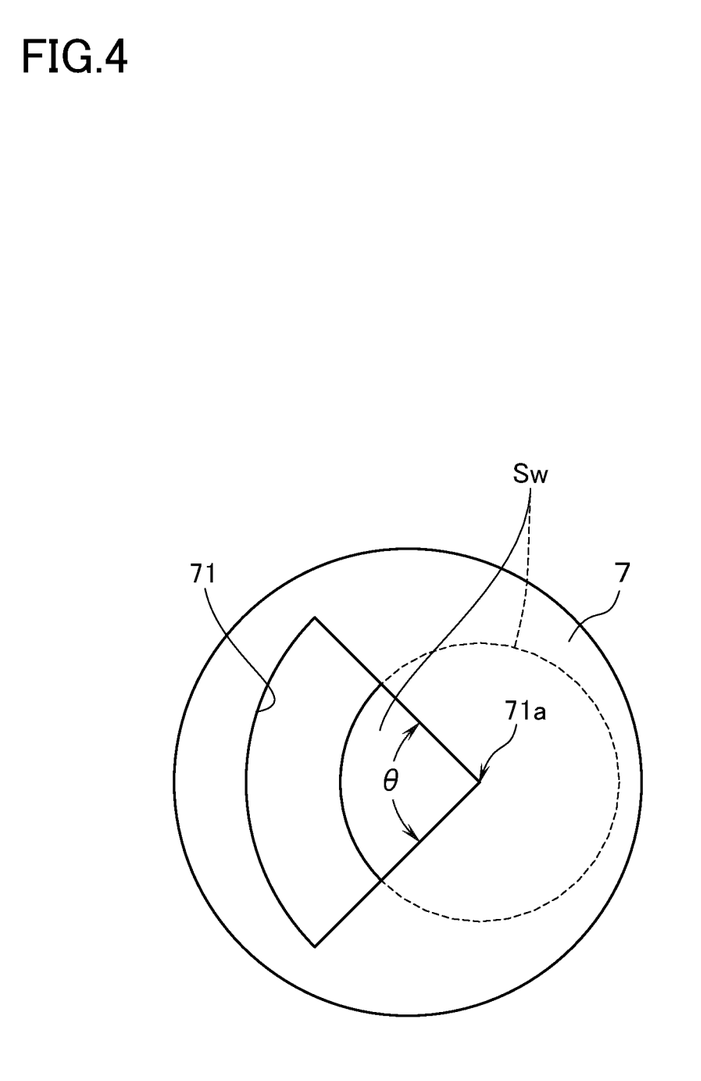
FIG. 4 is a schematic plan view of a distribution plate shown in FIG. 3.

Descriptions have so far been made of embodiments of this invention, but this invention shall not be limited to the above embodiments. As long as not deviating from the substance of this invention, various modifications are available. In the above-mentioned embodiment, depending on the arrangement and the like of the first through-holes 61b in the second target 61, there is a case in which the film thickness distribution of the thin film formed on the surface of the substrate Sw gives rise to deviation. As a solution, the following arrangement may be employed, namely, like a sputtering apparatus relating to a modified example as shown in FIG. 3, in a space between the second target 61 and the stage 4, there may be provided a distribution plate 7 which restricts a part of the sputtered particles passing through the first through-holes 61b of the second target 61 directing toward the substrate Sw. This kind of distribution plate 7 has formed therein, as shown in FIG. 4, an opening part 71 having a contour of a fan, allowing for passage of the sputtered particles to the side of the substrate Sw. In other words, the opening part 71 is so arranged that the opening area gradually increases from an origin 71a which is a predetermined position (a position, e.g., corresponding to the center of the substrate Sw) of the distribution plate 7, toward radially outward. The central angle θ of the opening part 71 is appropriately set depending on the film thickness distribution. This opening part 71 may also be formed as a notched part, or shall not be limited to a case in which the opening part is provided in one place of the distribution plate 7, but may be provided as a plurality of opening parts which are separate from one another. It may alternatively be so arranged that a driving shaft 72a of the moving means 72 is connected to a side surface of the distribution plate 7 so that the distribution plate 7 is moveable along an offset direction (left-and-right direction in FIG. 1) of the substrate Sw relative to the center of the first target 21.

Further, in a space between the second target 61 and the stage 4 (in this modified example right below the second target 61), there is disposed an electrode plate 8 of ground potential in a manner to lie opposite to the second target 61. Accordingly, it is so arranged that there occurs no disadvantage in that a plasma atmosphere is formed in a space between the second target 61 and the substrate Sw whereby the lower surface of the second target 61 gets sputtered. By the way, the electrode plate 8 has formed therein, in a manner to correspond to the first through-holes 61*b* of the second target 61, a plurality of second through-holes 81 which allow for the passage of the sputtered particles. The sputtered particles from the first target 21 pass through the first through-holes 61*b* of the second target 61 and the second through-holes 81 in the electrode plate 8 to thereby get adhered to the substrate Sw.

In the above-mentioned embodiment, a description was made of an example in which the substrate Sw is offset from the center of the first target 61 in a radially one direction in order to form a thin film on a surface of a relatively large substrate Sw by using a relatively small first target 21. However, this invention can also be applied to a case in which the center of the first target 21 and the center of the substrate Sw are positioned on the same line. In this case, too, the second target 61 itself serves the function of a collimator which restricts the sputtered particles incident on the substrate Sw beyond a predetermined angle relative to the imaginary line connecting the centers of the substrate Sw and of the first target 21. Therefore, there is no need of setting the T/S distance long.

In addition, in the above-mentioned embodiment, a description was made of an example in which a Cu film was formed on the surface of the substrate Sw by using one made of Cu as the first and the second targets 21, 61. However, without being limited thereto, this invention can be applied to a case in which a metal film of Al and the like, which is other than the Cu film, is formed or to a case in which an insulating film such as aluminum oxide and the like is formed.

Further, depending on the distance between the first target 21 and the second target 61, and the bias voltage to be applied to the second target 61, there is a case in which the electrical discharging between the first target 21 and the second target 61 becomes unstable. In this case, in order to stabilize the discharging, it may be so arranged that an output to apply voltage with positive potential may be connected to the deposition preventive plate 5 in the ground potential so that the deposition preventive plate 5 serves the dual function as the shield.

In the above-mentioned embodiment, the application of the bias voltage to the deposition preventive body (second target) 61 is performed during the sputtering of the first target 21. However, as another step, an arrangement may be made that the above-mentioned application of the bias voltage may be performed as separate step independently after having finished the film formation by sputtering of the first target 21. In other words, the steps include: a first step of sputtering the first target 21 to thereby cause to adhere the sputtered particles to the second target (adhesion body) 61; and a second step of applying the bias potential to the first target 21 to thereby cause to adhere once again to the first target, those sputtered particles that have been adhered to the second target 61. In this case, the bias potential to be applied to the second target 61 need not be made lower than the voltage to be applied to the first target 21.

In the above-mentioned embodiment, a description was made of an example in which the second target 61 is disposed as the adhesion body. However, what is disposed, such for example as an adhesion preventive plate 5, in a position in which the sputtered particles splashed from the first target 21 inside the vacuum chamber 1 get adhered, may be made to serve as the adhesion body. In this case, the deposition preventive plate 5 may be formed of a material equal in kind to the first target 21, or such an inner peripheral surface (adhesion surface) of the deposition preventive plate 5 as is deposited with the sputtered particles may be covered with the same material equal in kind to that of the first target 21, and then the bias power may be connected to the deposition preventive plate 5.

EXPLANATION OF MARKS

SM sputtering apparatus
Sw substrate (to-be-processed substrate)
1 vacuum chamber
21 target, first target
4 stage
61 adhesion body, second target
61*a* adhesion surface
61*b* first through-hole
62 bias power supply
7 distribution plate
8 electrode plate
81 second through-hole

The invention claimed is:

1. A sputtering apparatus comprising:
    a vacuum chamber having disposed therein a target, in which: the vacuum chamber is adapted to form therein a plasma atmosphere for sputtering the target having a sputtering surface;
    sputtered particles splashed from the target are caused to get adhered to, and deposited on, a surface of a to-be-processed substrate disposed in the vacuum chamber to thereby form a predetermined thin film thereon, wherein:
    at such a predetermined position inside the vacuum chamber as is subject to adhesion of the sputtered particles splashed from the target, there is disposed an adhesion body whose at least the surface of adhesion of the sputtered particles is made of a material equal in kind to that of the target; and
    the plasma atmosphere is generated between the sputtering surface and an adhesion surface of the adhesion body,
    the adhesion body has connected thereto a bias power supply for applying a bias voltage having negative potential at a time of forming the plasma atmosphere.

2. The sputtering apparatus according to claim 1, in which the target is defined as a first target, the adhesion body is defined as a second target that is made of a material equal in kind to that of the first target, and in which the first target and the to-be-processed substrate are disposed inside the vacuum chamber to lie opposite to each other,
    wherein the second target is disposed in a space between the first target and the to-be-processed substrate in a manner to lie opposite to the first target, and
    wherein the second target has opened through a plate thickness of the second target a first through-hole in a manner to allow for passage therethrough of the sputtered particles.

3. The sputtering apparatus according to claim 2, wherein the first through-hole comprises a plurality of through-holes.

4. The sputtering apparatus according to claim 2, provided that the direction from the to-be-processed substrate toward the first target is defined to be upward, in which the first target and the to-be-processed substrate are offset to each other in a direction at right angles to the upward direction, the sputtering apparatus further comprising: a stage which rotatably holds the to-be-processed substrate; and a distribution plate disposed in a space between the second target and the stage in order to partly restrict the sputtered particles that pass through the first through-hole and proceed toward the to-be-processed substrate.

5. The sputtering apparatus according to claim 4, further comprising an electrode plate of grounding potential disposed in the space between the second target and the stage, the electrode plate having formed therein a second through-hole allowing for the passage of the sputtered particles.

6. A sputtering method using the sputtering apparatus according to claim 1, comprising the steps of:
   sputtering the target to thereby cause the sputtered particles to get adhered to the adhesion body; and
   at the same time, applying to the adhesion body a bias potential which is lower than the voltage to be applied to the target so as to cause to adhere the sputtered particles, once adhered to the adhesion body, once again to the target.

7. The sputtering method using the sputtering apparatus according to claim 1, comprising:
   a first step of sputtering the target to thereby cause the sputtered particles to get adhered to the adhesion body; and
   a second step of applying to the adhesion body a bias potential so as to cause to adhere the sputtered particles, already adhered to the adhesion body, once again to the target.

8. The sputtering apparatus according to claim 1, wherein a distance between the sputtering surface $21b$ and the surface $61a$ of the adhesion body $61$ is located in a range of 25 mm to 250 mm.

9. The sputtering method using the sputtering apparatus according to claim 1, wherein the second target $61$ has a plurality of first through-holes $61b$ that penetrate in a vertical direction, and an opening ratio of the first through-holes is set to 15% to 75%.

* * * * *